United States Patent [19]
Freeman

[11] Patent Number: 5,663,652
[45] Date of Patent: Sep. 2, 1997

[54] METHOD FOR MEASURING CURRENT DISTRIBUTION IN AN INTEGRATED CIRCUIT BY DETECTING MAGNETO-OPTIC POLARIZATION ROTATION IN AN ADJACENT MAGNETO-OPTIC FILM

[75] Inventor: Mark Russel Freeman, Yorktown Heights, N.Y.

[73] Assignee: International Business Machines Corporation, Armonk, N.Y.

[21] Appl. No.: 481,667

[22] Filed: Jun. 7, 1995

Related U.S. Application Data

[62] Division of Ser. No. 968,719, Oct. 30, 1992, Pat. No. 5,451,863.
[51] Int. Cl.$^6$ ............................. G01R 19/00; G01R 31/00
[52] U.S. Cl. ......................... 324/753; 324/96; 324/750; 324/752
[58] Field of Search .................... 324/158.1, 73.1, 324/96, 117 R, 244.1, 750, 751, 752, 549, 765, 753; 359/281, 282, 246, 248, 280; 250/227.17, 225; 385/2; 332/7.51

[56] References Cited

U.S. PATENT DOCUMENTS

| | | | |
|---|---|---|---|
| 3,474,428 | 10/1969 | Nelson et al. | 359/281 |
| 3,516,080 | 6/1970 | Smith | 359/281 |
| 3,680,065 | 7/1972 | Almasi et al. | 359/282 |
| 4,973,899 | 11/1990 | Jones et al. | 324/96 |
| 4,983,025 | 1/1991 | Umemura | 359/282 |

*Primary Examiner*—Vinh P. Nguyen
*Attorney, Agent, or Firm*—Robert M. Trepp; Ronald L. Drumheller

[57] ABSTRACT

An apparatus and method for measuring the current distribution in an integrated circuit with high time resolution is described incorporating a magneto-optic film, a linearly polarized light beam and a means for measuring the magneto-optic polarization rotation of a light beam and circuitry for synchronizing test pulses in an integrated circuit. The invention overcomes the problem of determining current distribution as a function of time and location in an integrated circuit with 1 psec time resolution and 1 micrometer spatial resolution.

8 Claims, 5 Drawing Sheets

METHOD FOR MEASURING CURRENT DISTRIBUTION IN AN INTEGRATED CIRCUIT BY DETECTING MAGNETO-OPTIC POLARIZATION ROTATION IN AN ADJACENT MAGNETO-OPTIC FILM

This is a divisional application of application Ser. No. 07/968,719 filed Oct. 30, 1992, now U.S. Pat. No. 5,451,863.

BACKGROUND OF THE INVENTION

1. Field of the Invention

This invention relates to magneto-optic probes and, more particularly, to measuring the magneto-optic polarization rotation in a thin film magnetic film for imaging the spatial and temporal current distribution in an adjacent material such as an integrated circuit.

2. Background Art

Presently, integrated circuits are tested by making electrical connection to contacts or pads provided on an integrated circuit chip and applying electrical signals to selected pads and monitoring the output signals at other selected pads. In the event of an electrical failure on the integrated circuit or where the integrated circuit does not meet normal specifications, it is difficult to locate within the integrated circuit the actual currents and waveforms which result in the output signal. Further, some integrated circuits have very high speeds and the capacitance of the pads nullify the high speed waveforms present at internal nodes in the integrated circuit. New, non-destructive methods for monitoring the currents within an integrated circuit chip are, therefore, desirable.

A magnetic field passing through a material causes changes in the index of refraction for different polarization vectors, leading to polarization rotations (Faraday, Kerr effects) or intensity changes (magnetoabsorption). In magneto-optic materials these effects are large enough to be useful. A polarized light beam passing through a magneto-optic material will be subject to the change of the index of refraction resulting in an apparent rotation of the polarized light. The amount of rotation is an indication of the change of the index of refraction, which in turn is an indication of the instantaneous amplitude of the magnetic field.

U.S. Pat. No. 4,956,607 which issued on Sep. 11, 1990 to M. Abe et al. shows an arrangement including a polarizer, a magneto-optic element, an analyzer and a light sensitive element for measuring the polarization rotation of the light for measuring the current in a power line by directing a beam of light through the polarizer and magneto-optic element in the direction of the magnetic field. The magneto-optical element may include yttrium-iron-garnet (YIG) material or ferromagnetic glass and lead glass.

U.S. Pat. No. 4,947,107 which issued on Aug. 7, 1990 to R. W. Docrfler et al. describes a sensor for sensing the magnitude of current flowing in a conductor based upon the Faraday effect. A polarized light beam passes through a magneto-optic element without substantial internal reflection in the magneto-optic element wherein the element rotates the plane of polarization of the input beam in proportion to a magnetic field coupled in parallel to the light beam.

U.S. Pat. No. 4,933,629 which issued on Jun. 12, 1990 to Y. Kozuka et al. describes a method and apparatus for measuring the strength of an AC electric field based on a light beam which is transmitted through and thus modulated by an optical sensing head due to the Pockel's and Faraday effects while the sensing head is exposed to the AC electric and magnetic fields. A polarized light beam passes through an optical element and then an analyzer and light sensitive element.

U.S. Pat. No. 4,823,083 which issued on Apr. 18, 1989 to P. L. Meunier describes a head for measuring of magnetic fields using the effect of the magnetic field on polarization of light. A light beam is directed through a ferromagnetic material such as yttrium-iron-garnet (YIG) wherein the light beam experiences a rotation of its planar polarization owing to the Faraday effect caused by the magnetic field.

A class of materials which exhibit greatly enhanced magneto-optical light modulation is described in U.S. Pat. No. 3,418,036 which issued on Dec. 24, 1968 to F. Holtzberg et al. In U.S. Patent '036, europium chalcogenides in pure form or in solid solutions with other rare earth chalcogenides have far larger Verdet constants than other materials commonly known in the art. Europium chalcogenides may include, for example, europium sulfide, europium selenide, curopium oxide and curopium telluride.

SUMMARY OF THE INVENTION

In accordance with the present invention, a method and apparatus for measuring the current distribution in an integrated circuit or oilier material with high time resolution is described comprising the steps of positioning a magneto-optic material such as a ferromagnetic film in proximity to the surface of an integrated circuit or other material whereby the ferromagnetic film is in a magnetic field formed by currents in the integrated circuit, launching electrical pulses in the integrated circuit, reflecting a laser beam from the lower surface of a ferromagnetic film, and measuring the magneto-optic polarization rotation induced in the reflected laser beam by the ferromagnetic film.

The invention further provides synchronizing the reflection of the laser beam with the launching of electrical pulses which may be repeated a number of times to provide art output signal of the current at an instant of time whereby the current can be imaged with 1 psec time resolution.

It is an object of the invention to measure current in a non-contact manner in integrated circuits or in materials such as metal conductors, superconductors and semiconductors.

It is a further object of the invention to measure current in a non-contact manner in an integrated circuit having a spatial resolution of one micrometer and higher depending on the wavelength of light used.

It is a further object of the invention to position a layer of magneto-optic material such as curopium sulfide, bismuth-doped yttrium-iron-garnet (YIG), calcium-doped yttrium-iron-garnet, $Y_{3-x}Ca_xFe_2(Fe_{3-x}Si_x)O$ where x is≈2.

It is a further object of the invention to pass a polarized beam through a magneto-optic film and to sense the change of polarization due to a change in the magnetic field in the film or layer utilizing the Faraday effect.

It is a further object of the invention to provide a polarized beam of light which is reflected from a magneto-optic material to provide a change in the polarization of the light beam as a function of the magnetic field in the material utilizing the Kerr effect.

It is a further object of the invention to provide a beam of light which is reflected from a magneto-optic material to provide a change in time intensity of the light beam as a function of the magnetic field utilizing the magnetoabsorptive effect.

It is a further object of the invention to provide a pulsed polarized light beam which may be synchronized with respect to an electrical waveform in an integrated circuit or device.

It is a further object of the invention to provide a sequence of images of a magneto-optic material synchronized with an electrical waveform in an integrated circuit or device wherein the sequence of images represent a sequence of consecutive times being the same or varying with respect to the synchronized waveform.

It is a further object of the invention to provide stroboscopic images of the instantaneous current distribution using a sensitive polarizing microscope to record the magneto-optic rotation pattern induced in the magnetic thin film.

It is a further object of the invention to position magneto-optic material on the end of a cleaved fiber optic cable which may be physically scanned over a surface of an integrated circuit, device, or other material wherein a polarized light beam in the fiber optic is reflected from the magneto-optic material and wherein the spatial resolution is equal to or less than the core diameter of the optical fiber.

BRIEF DESCRIPTION OF THE DRAWING

These and other features, objects, and advantages of the present invention will become apparent upon a consideration of the following detailed description of the invention when read in conjunction with the drawing, in which.

DESCRIPTION OF THE PREFERRED EMBODIMENT

Figure 1:
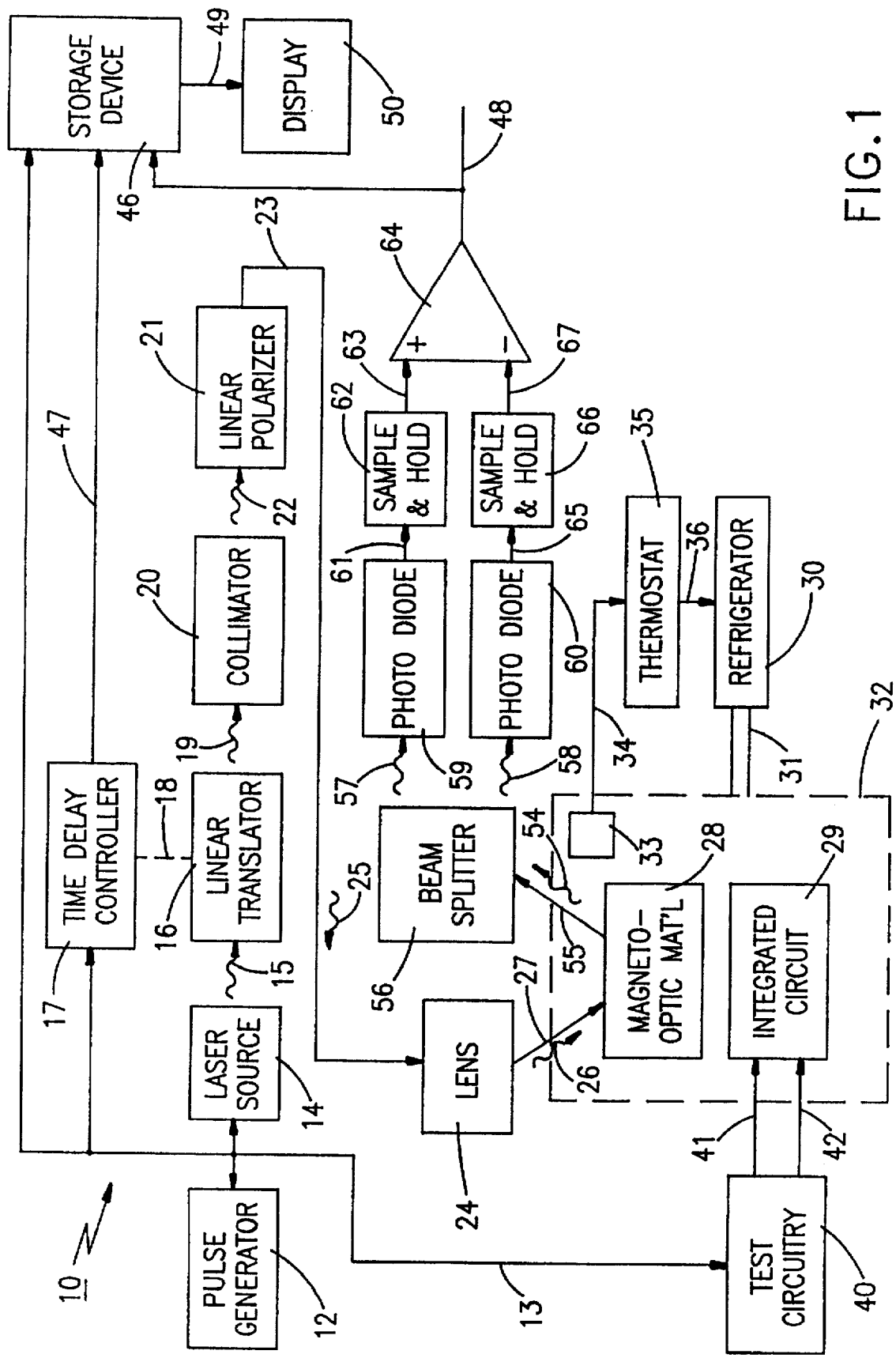
FIG. 1 is a block diagram of one embodiment of the invention.

Referring now to the drawing, FIG. 1 shows a block diagram of a magneto-optic prober 10 for measuring the current distribution in an integrated circuit with high time resolution. Pulse generator 12 generates a trigger pulse over lead 13 to an input of laser source 14. Laser source 14 may be, for example, a diode laser, a titanium sapphire laser which may, for example, operate at 2 watts output, or a dye laser which may be, for example, 100 mW and have a wavelength in the range from 560 to 670 nanometers. Other monochromatic light sources would be suitable for a laser source 14. An optical beam is coupled from laser source 14 as shown by arrow 15 to linear translator 16. Linear translator 16 functions to provide a time delay in the range from 0 to 10 nanoseconds to the optical path length of the light beam from laser source 14. Time delay controller 17 functions to control the optical path length by way of mechanical linkage 18 to linear translator 16. The optical beam from linear translator 16 shown by arrow 19 is coupled through collimator 20 to linear polarizer 21. Collimator 20 functions to collimate the input light beam shown by arrow 19 to provide a collimated output beam shown by arrow 22. Linear polarizer 21 functions to polarize the input light beam shown by arrow 22 to provide a linearly polarized light beam over fiber optic cable 23 to lens 24. Optical fiber 23 may be a single mode optical fiber for conveying the linearly polarized light beam from linear polarizer 21 shown by arrow 25. Lens 24 functions to provide an output light beam shown by arrow 26 over path 27 to magneto-optic material 28.

Magneto-optic material 28 may be positioned over integrated circuit 29 so as to place magneto-optic material 28 in magnetic fields of the conductors of integrated circuit 29. Magneto-optic material 28 may also be cooled to a predetermined temperature such as below room temperature or below 78° centigrade, the temperature of liquid nitrogen. Refrigerator 30 functions to provide a coolant path over duct 31 to chamber 32. Integrated circuit 29, as well as magneto-optic material 28 may be located in chamber 32. A temperature sensor 33 may be positioned in chamber 32 having an output coupled over lead 34 to an input of thermostat 35. Thermostat 35 functions to control the temperature of chamber 32 and has an output coupled over lead 36 to refrigerator 30 to cool magneto-optic material 28 and chamber 32.

The output of pulse generator 12 is coupled over lead 13 to an input of test circuitry Test circuitry 40 functions to respond to the trigger pulse on lead 13 to provide waveforms over, for example, leads 41 and 42 to integrated circuit 29 for testing the circuitry of integrated circuit 29. The waveforms on leads 41 and 42 may cause current to flow in certain conductors in integrated circuit 29. In the arrangement shown in FIG. 1, when a trigger pulse is generated on lead 13, tea circuitry 40 generates waveforms causing internal waveforms and internal currents in integrated circuit 29 which are repeatable after an adequate time period to allow transients to settle. Lead 13 is also coupled to an input of time delay controller 17 so that, for example, time delay controller 17 may provide increments of delay after a number of trigger pulses have occurred on lead 13. In this way, time delay controller 17 may scan a current waveform in an integrated circuit 29. Lead 13 is also coupled to storage device 46. An electrical output of time delay controller 17 indicative of the delay is coupled over lead 47 to an input of storage device 46. Storage device 46 functions to store the polarization rotation signal appearing on lead 48 along with the time delay on lead 47 with the trigger pulse on lead 13. Storage device 46 may have an output coupled over lead 49 to display 50. Display 50 functions to display the polarization rotation signal as a function of time.

The polarization rotation signal is generated by the light beam shown by arrow 54 along path 55 after passing through magneto-optic material 28. The light beam shown by arrow 54 passes into beam splitter 56 which may be, for example, a Thompson beam splitter to provide two light beams shown by arrows 57 and 58 which are directed to respective photodiodes 59 and 60. Photodiodes 59 and 60 function to detect the amount of polarized light received froth beam splitter 56. The output of photodiode 59 is coupled over lead 61 to an input of sample and hold circuit 62. Sample and hold circuit 62 functions to hold the output signal of photodiode 59 and to provide an output over lead 63 to an input of differential amplifier 64. Photodiode 60 is coupled over lead 65 to an input of sample and hold circuit 66. The output of sample and hold circuit 66 is coupled over lead 67 to an input of differential amplifier 64. Differential amplifier functions to provide an output signal on lead 48 at times there is a change in the amplitude of the respective inputs on lead 63 and 67. Beamsplitter 56 and photodiodes 59 and 60, in conjunction with differential amplifier 64, provides a means for measuring the magneto-optic polarization rotation induced in the light beam passing through the magneto-optic material which may be, for example, a ferromagnetic film.

Figure 2:
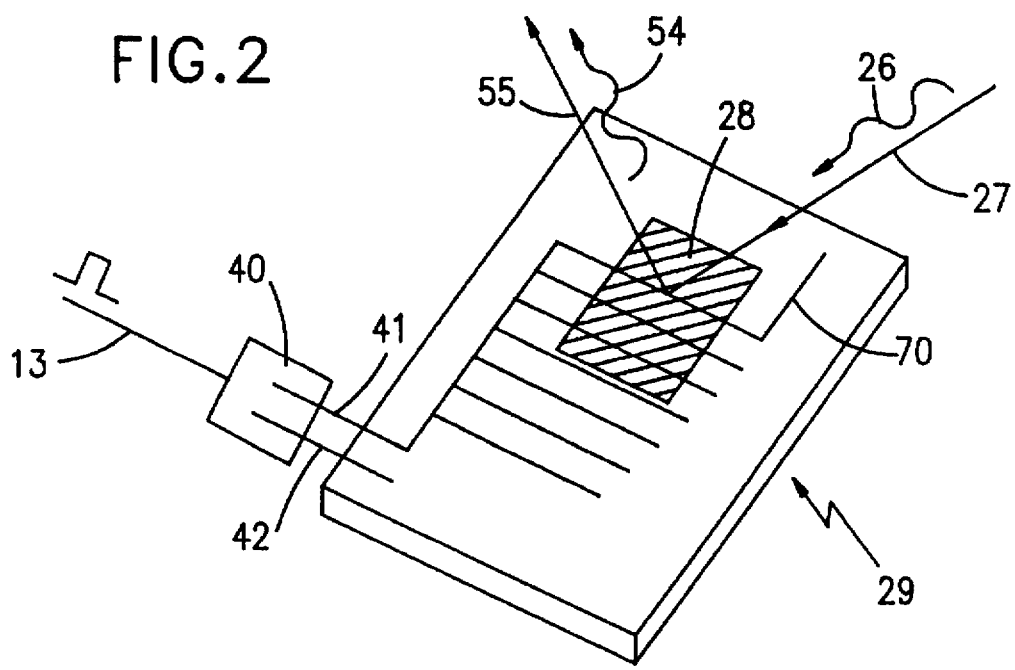
FIG. 2 is a perspective view of a test setup of an integrated circuit and of magneto-optic material.

FIG. 2 is a perspective view of the magneto-optic material 28 in relation to integrated circuit 29. In FIG. 2, like references are used for functions corresponding to the apparatus of FIG. 1. A light beam shown by arrow 26 follows path 27 to magneto-optic material 28. The light beam enters magneto-optic material 28 and is reflected at the bottom surface and passes back through magneto-optic material 28 and out shown by arrow 54. The change in the polarization rotation due to a change in the indices of refraction due to the local magnetic field is known as the Faraday effect. If the light beam shown by arrow 26 is reflected by the upper surface of magneto-optic material 28 then the change in polarization rotation due to the local magnetic field is known as the Kerr effect. Either the Faraday effect or the Kerr effect may be used in interrogating magneto-optic material 28 with a polarized light beam. The light beam shown by arrow 26 may be directed to the magneto-optic material 28 where it passes over a conductor 70 of integrated circuit 29 to detect the currents in conductor 70. Magneto-optic material 28 may be a film on a substrate wherein the film is placed adjacent to conductor 70. Alternately, magneto-optic material 28 may be conformally formed over integrated circuit 29. An insulation layer, if necessary, may be inserted between magneto-optic material 28 and integrated circuit 29 to prevent shorting if the magneto-optic material is of low ohmic resistance. A conformal coating of magneto-optic material on integrated circuit 29 would provide maximum spatial resolution and sensitivity to the currents in conductor 70.

Figure 3:
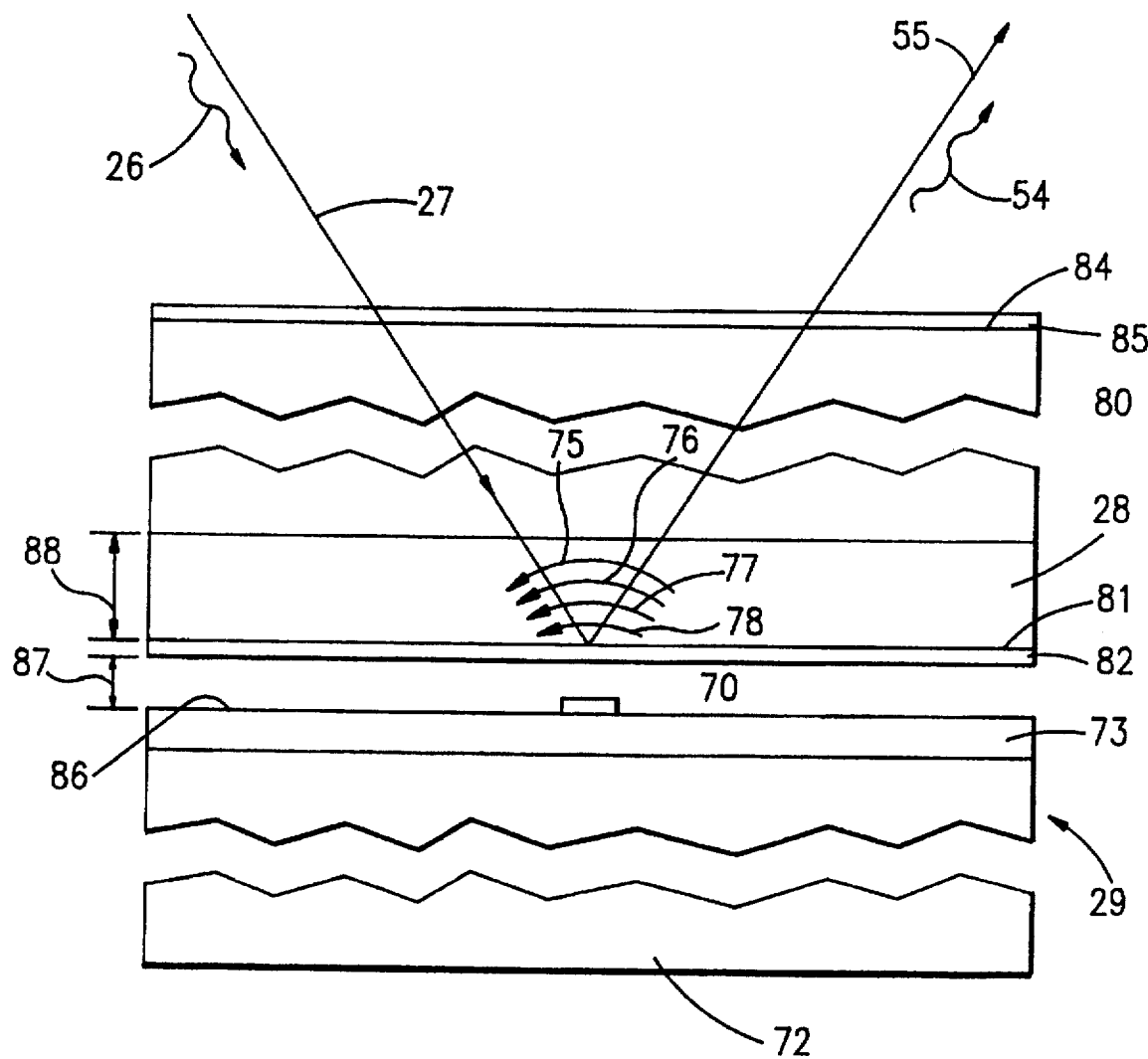
FIG. 3 is a cross-section view of an integrated circuit and magneto-optic material.

FIG. 3 is a cross-section view of an integrated circuit and magneto-optic material thereover. As shown in FIG. 3, magneto-optic material 28 may be formed on a substrate 80 which is transparent to the light beams shown by arrows 26 and 54. Light beam 26 passes through substrate 80 and through magneto-optic material 28 to the lower surface 81 of magneto-optic material 28. Lower surface 81 may have a reflecting coating 82. Reflecting coating 82 may be, for example, aluminum having a thickness of, for example, 300 Å which is sufficient to reflect the polarized light beam, and oxidized so as to not be conductive and short out conductor 70 to other conductors on integrated circuit 29. Substrate 80 may have on its upper surface 84 a quarter wave anti-reflection coating to prevent the polarized light beam from being reflected from surface 84. The spacing between magneto-optic material 28 and the upper surface 86 of integrated circuit 29 may be in the range from 0.1 to 10 micrometers as shown by arrow 87. The thickness of magneto-optic material 28 may be in the range from 1 to 10 micrometers as shown by arrow 88. In the case where magneto-optic material is conformally coated on upper surface 86, the thickness of the magneto-optical material may be adjusted to be a quarter wavelength of the light being used to pass through the magneto-optic material.

Alternately, magneto-optic material may be formed on or positioned over superconducting materials, metals or semiconductor surfaces. Test circuitry 40 shown in FIG. 1 may include a coil or coils for inducing eddy currents in the sample to be investigated or to subject the sample to a magnetic field which may be time varying or constant. Further, test circuitry 40 may include electrodes for placing an electric field across the sample which may be time varying or constant.

Magneto-optic material 28 may be, for example, europium sulfide which is cooled to or below the temperature of liquid nitrogen, i.e. 78° C. Magneto-optic material 28 may be calcium-doped yttrium-iron-garnet which may be represented by the formula $Y_{3-x}Ca_xFe_2(Fe_{3-x}Si_x)O$ where $x \simeq 2$. Calcium doped yttrium-iron-garnet (YIG) orders ferromagnetically just below room temperature. Gadolinium-gallium-garnet (GGG) is paramagnetic at room temperature. More sensitivity can be obtained with magneto-optic materials having a higher magnetic susceptibility at room temperature.

The light beam shown by arrow 26 may be a pulse in the range from 0.5 to 10 psec and may be focussed to a narrow spot depending on the wavelength of the light beam which may be in the visible or infrared range. A spot size impinging on and passing through magneto-optic material 28 on lower surface 81 may be as small as 1 micrometer in diameter. In FIG. 3 as the light beam passes through the magnetic field shown by magnetic lines 75 through 78, the index of refraction of the magneto-optic material 28 changes by virtue of the magnetic field in the material locally and causes a change in the linear polarization of the light beam. The change in polarization of the light beam due to the change in the index of refraction causes the light beam shown by arrow 54 to have a rotation in polarization. The component of light travelling through the magneto-optic material in the direction of the magnetic field is affected by the change in index of refraction in that direction. The apparent rotation of the linear polarization of the light beam may be in the range from 0° to 5° rotation and have a sensitivity such as $4 \times 10^6$ degrees rotation per cmT. Current sensitivity is of the order of 10 $\mu A/\sqrt{Hz}$ in this case, for 1 μm spatial resolution. Thus, the rotation of the linear polarization of the light beam may be used to determine the amplitude or the magnitude of the instantaneous local magnetic field that the light beam passed through, which in turn, is a measure of the current in conductor 70 where conductor 70 is the only conductor in close range to cause the magnetic field in magneto-optic material 28 above conductor 70.

A laboratory test was made using the embodiment shown in FIG. 1 without chamber 32, refrigerator 30, sensor 33, and thermostat 35. The light pulse was 1 psec long. The magneto-optic material was GGG which is non-conducting with a reflecting layer of 300 Å of aluminum similar to the embodiment shown in FIG. 3 except that anti-reflection coating 85 was absent. The arrangement of integrated circuit and magneto-optic material 28 is shown in FIG. 2 and FIG. 3. The thickness of the magneto-optic material was 10 micrometers.

Figure 4:
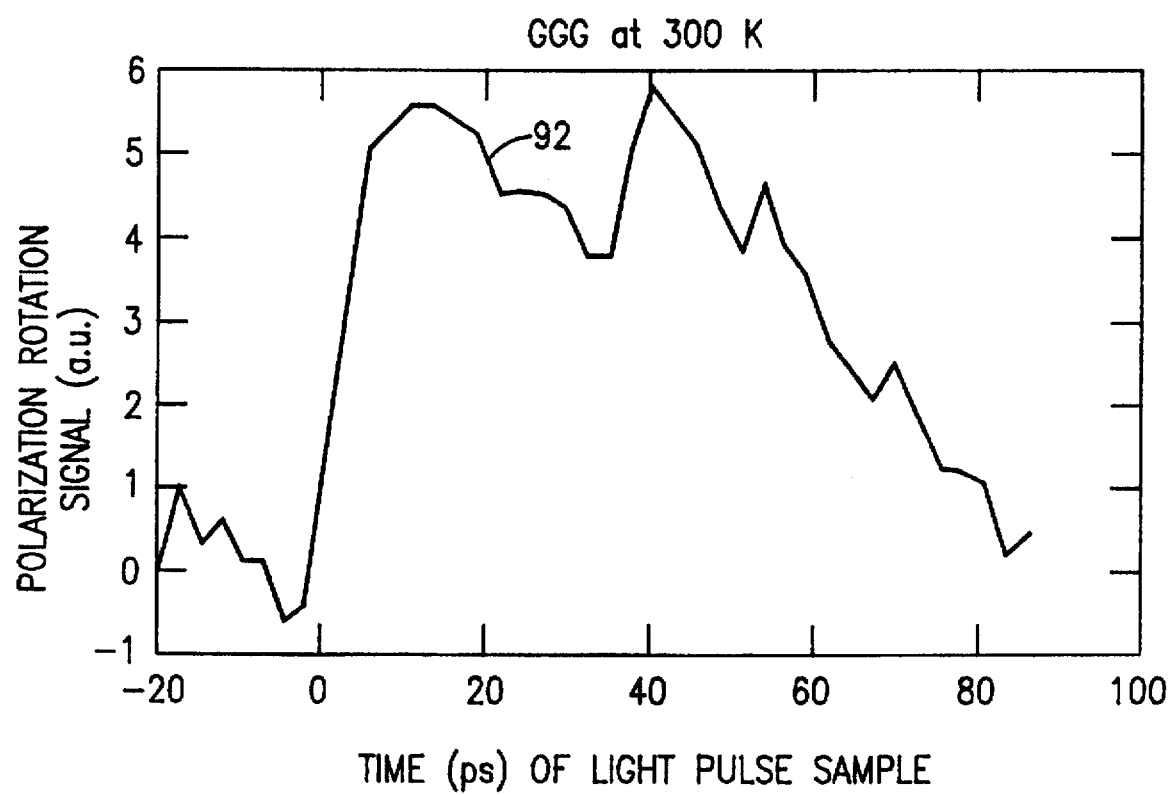
FIG. 4 is a graph of the polarization rotation signal versus time delay of the sampling light pulse passing through magneto-optic material, owing to a synchronized current pulse.

FIG. 4 is a graph of the polarization rotation signal versus time with respect to the trigger pulse on lead 13. Linear translator 16 moved the 1 psec pulse from −20 to 90 ps shown in FIG. 4. In FIG. 4, the ordinate represents polarization rotation signal in arbitrary units and the abscissa represents time with respect to the trigger pulse. Test circuitry 40 provided a square wave pulse to conductor 70 having a duration of about 80 psec. Curve 92 in FIG. 4 shows the output signal on lead 48 shown in FIG. 1 over the range from −20 to 90 ps time where the sampling pulse of 1 psec duration is scanned from −20 to 90 psec. The temperature of the magneto-optic material was 300° Celsius during the time data was taken for curve 92. Laser source 14 was a dye laser tuned to a wavelength in the range from 560 to 670 nm. The polarization rotation signal shown in FIG. 4 did not exceed 5°.

Figure 5:
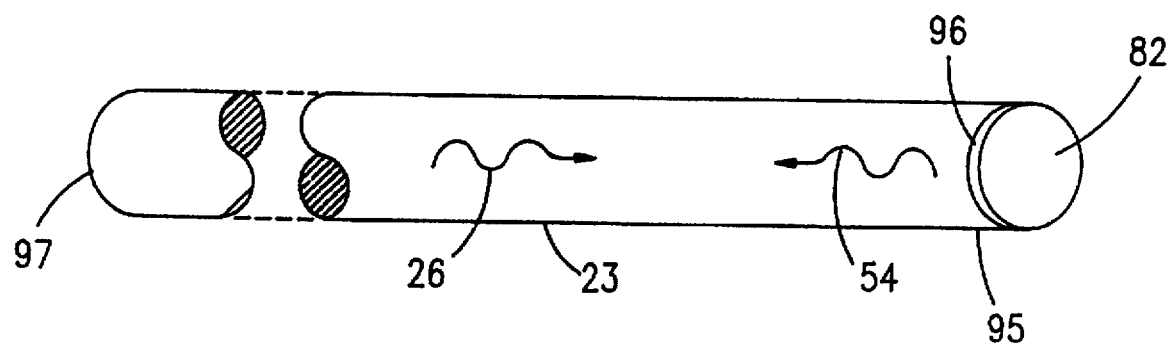
FIG. 5 is a first alternative embodiment of the invention.

FIG. 5 shows an alternate embodiment of the invention. In FIG. 5 like references are used for functions corresponding to the apparatus of FIGS. 1–3. Optical fiber 23 is cleaved at end 95 and a layer of magneto-optic material 96 is formed thereon. The magneto-optic material 96 may be the same as the materials used for magneto-optic material 28. The fiber may be hand held or mechanically held and conveniently moved or mechanically positioned over and against the surface or close to the surface of integrated circuit 29 shown in FIG. 1. Thus, the light beam shown by arrow 26 and a reflected light beam shown by arrow 54 would stay in optical fiber 23 until it was coupled in or out at end 97. End 97 of optical fiber 23 would optically be coupled to a source of linear polarized light and to a beam splitter for detecting the polarization rotation in the reflected polarized light after passing through magneto-optic material 96 and back. Laser source 14 and beam splitter 56 shown in FIG. 1 would be suitable. A reflecting layer 82 may be formed over magneto-optic material 96. In this example the use of a magneto-absorptive material may be preferable to avoid artifacts from polarization shifts occurring in a hand-held fiber.

Figure 6:
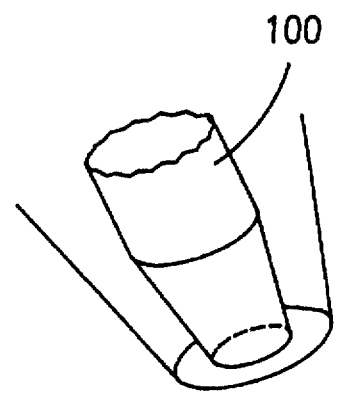
FIG. 6 is a second alternate embodiment of the invention.
Figure 6:
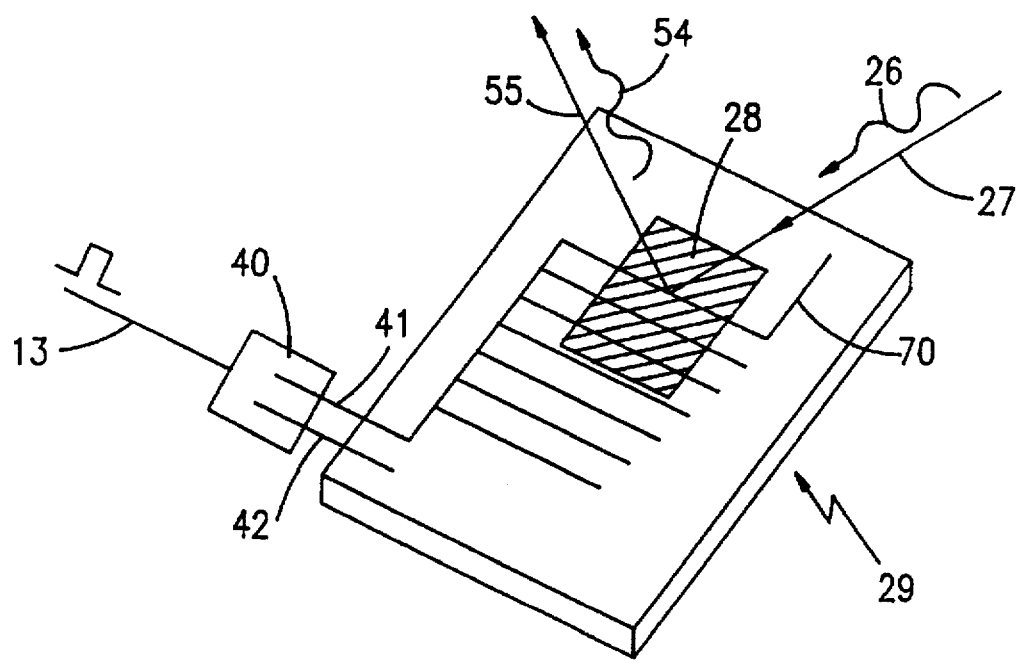

FIG. 6 shows an apparatus for obtaining stroboscopic images of the instantaneous current distribution in integrated circuit 29. A sensitive polarizing microscope 100 is used to receive a reflected light beam along path 55 shown by arrow 54. Polarizing microscope 100 functions to record the magneto-optic rotation pattern induced in magneto-optic material 28. The time-delayed probe laser beam is directed along path 27 shown by arrow 26 and illuminates the entire magneto-optic material 28 or a portion thereof. Coupling to the magneto-optic material 28 will, in general, alter the performance to some deuce: for cases in which this problem is significant, the image must be acquired by scanning a small area. The magneto-optic material 28 may be operated to exhibit the Faraday effect or the Kerr effect. In FIG. 6, like references are used for functions corresponding to the apparatus of FIGS. 1–3.

Figure 7:
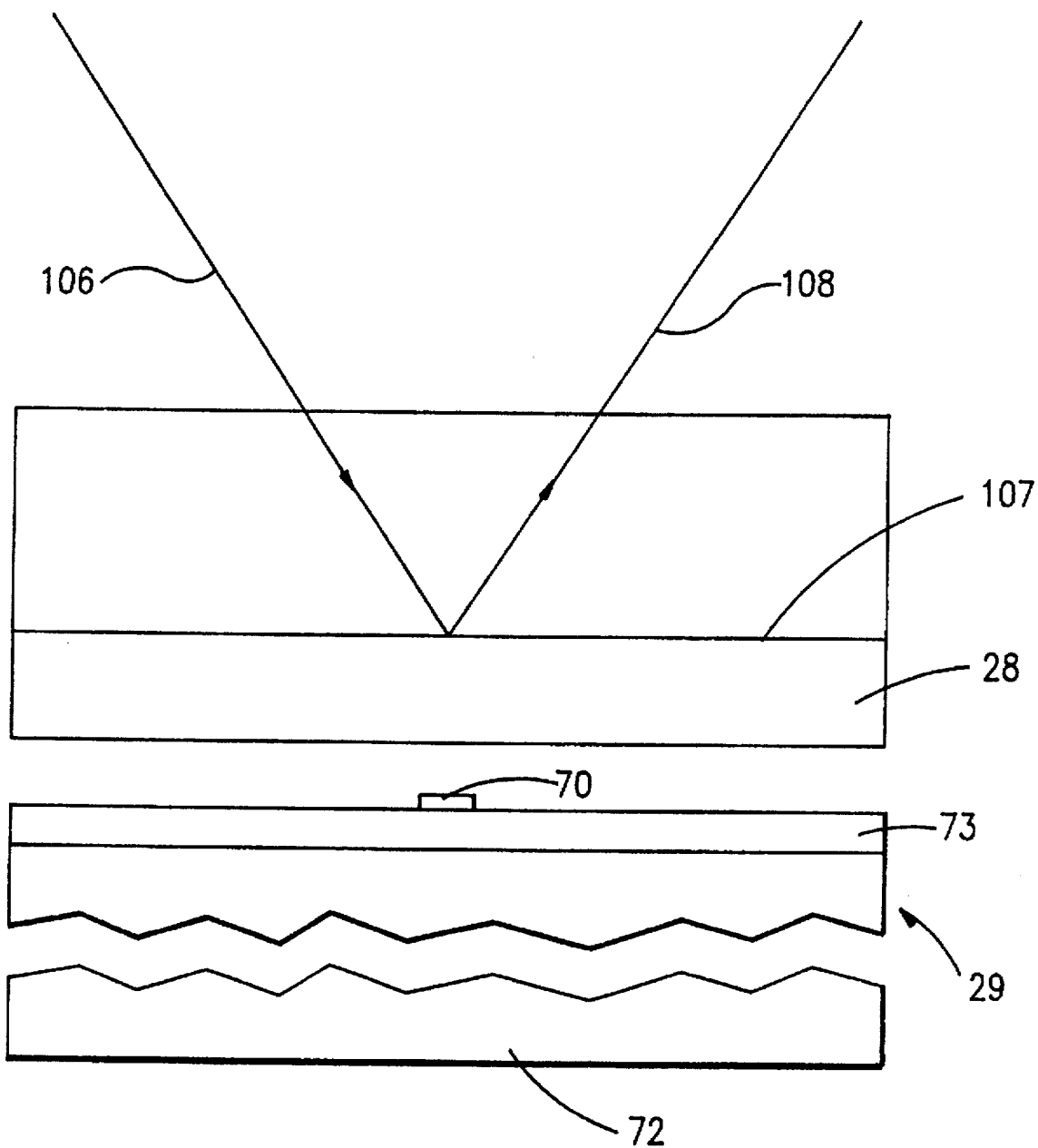
FIG. 7 is a cross-section view of an integrated circuit and magneto-optic material.

FIG. 7 is a cross-section view of an integrated circuit 29 and magneto-optic material 28. Light beam 106 is shown impinging on surface 107 of magneto-optic material 28. Surface 107 reflects light beam 106 as light beam 108. Light beam 108 will experience a polarization rotation due to the Kerr effect dependent upon the magnetic field in magneto-optic material 28. An example of a material useful for the embodiment shown in FIG. 7 is indium manganese arsenide (InMnAs). In FIG. 7, like references are used for functions corresponding to the apparatus of FIGS. 1–3.

The invention describes an apparatus and method for measuring the current distribution in an integrated circuit with 1 psec time resolution by measuring the magneto-optic polarization rotation induced in a thin paramagnetic or ferromagnetic film. A thin film of europium sulfide grown atop a transparent substrate is placed film side down on the integrated circuit and cooled below 78° Celsius. Electrical pulses in the circuit are launched synchronous with probe laser pulses, using a photo-sensitive or electrical trigger. The probe pulses are time-delayed relative to the electrical pulses using a mechanical delay line, such as a linear translator allowing imaging of the current distribution at an arbitrary instant of time during the course of the pulse propagation. Spatial resolution of 1–2 micrometers can be obtained by focussing the probe beam with a small lens onto a slide coated with a uniform film of magneto-optic material or by scanning a single-mode optical fiber with europium sulfide or other suitable material deposited on a cleaved end. The current sensitivity of the detector scales with the thickness of the magneto-optic film. When visible light is used, the film thickness is limited to the order of 1,000 Å by the strong optical absorption, yielding a current density of 10 mA/√Hz. If infrared light is used, the film thickness may be increased to 1 micrometer without degrading the spatial resolution, for a concomitant sensitivity of the order of 1 mA/√Hz. This sensitivity can increase to the order of 10 μA/√Hz for a very strong rotator such as ZnFeSe. If europium sulfide is selected for the magnetic material, cooling to at least liquid nitrogen temperature is required.

While there has been described and illustrated a magneto-optic prober for measuring the current distribution in an integrated circuit with high time resolution, it will be apparent to those skilled in the art that modifications and variations are possible without deviating from the broad scope of the invention which shall be limited solely by the scope of the claims appended hereto.

Having thus described my invention, what I claim as new and desire to secure by Letters Patent is:

1. A method for measuring the current distribution in an integrated circuit with high time resolution comprising the steps of:

applying electrical signals to an integrated circuit of interest to produce currents in said integrated circuit, positioning a magneto-optic film in sufficient proximity to a surface of said integrated circuit to bring said magneto-optic film into a magnetic field formed by at least one of said currents produced in said integrated circuit so as to provide detectable magneto-optic polarization rotation to light interacting with said magneto-optic film, directing laser beam pulses onto said magneto-optic film in synchronism with said electrical signals, and measuring magneto-optic polarization rotation induced by said magneto-optic film.

2. The method of claim 1 wherein said magneto-optic film includes europium sulfide (EuS).

3. The method of claim 1 wherein said step of directing includes the step of directing synchronously after a selected time period.

4. The method of claim 3 wherein said step of directing synchronously includes the step of varying said selected time period.

5. The method of claim 1 wherein said step of directing includes the step of focussing a laser beam on a selected area of said magneto-optic film.

6. The method of claim 1 wherein said step of directing includes the step of scanning a laser beam from a single-mode optical fiber over said magneto-optic film.

7. The method of claim 1 wherein said magneto-optic film is cooled.

8. The method of claim 1 wherein said magneto-optic film includes calcium-doped yttrium-iron-garnet, $Y_{3-x}Ca_xFe_2(Fe_{3-x}Si_x)O$ where $x \simeq 2$.

* * * * *